United States Patent
Migita et al.

(10) Patent No.: US 7,498,702 B2
(45) Date of Patent: Mar. 3, 2009

(54) MOTOR AND BUS BAR

(75) Inventors: Takayuki Migita, Kyoto (JP); Hiroaki Suzuki, Toyota (JP)

(73) Assignee: Nidec Corporation, Kyoto (JP)

( * ) Notice: Subject to any disclaimer, the term of this patent is extended or adjusted under 35 U.S.C. 154(b) by 510 days.

(21) Appl. No.: 11/236,868

(22) Filed: Sep. 28, 2005

(65) Prior Publication Data
US 2006/0068617 A1  Mar. 30, 2006

(30) Foreign Application Priority Data

Sep. 29, 2004  (JP) .............................. 2004-283320

(51) Int. Cl.
H02K 11/00 (2006.01)
(52) U.S. Cl. .......................................... 310/71; 310/43
(58) Field of Classification Search .................. 310/71, 310/43
See application file for complete search history.

(56) References Cited

U.S. PATENT DOCUMENTS

| | | | | |
|---|---|---|---|---|
| 3,151,278 A * | 9/1964 | Elarde | ......................... | 361/745 |
| 4,504,710 A * | 3/1985 | Bryant et al. | ............. | 200/80 R |
| 4,689,023 A * | 8/1987 | Strong et al. | ................ | 439/189 |
| 4,845,396 A * | 7/1989 | Huber | ......................... | 310/239 |
| 4,847,528 A * | 7/1989 | Eguchi et al. | ............... | 310/239 |
| 5,304,884 A * | 4/1994 | Kitajima et al. | ............. | 310/198 |
| 5,579,217 A * | 11/1996 | Deam et al. | .................. | 363/144 |
| 6,011,339 A * | 1/2000 | Kawakami | ................... | 310/208 |
| 6,208,056 B1 * | 3/2001 | Perkins | ....................... | 310/179 |
| 6,271,608 B1 * | 8/2001 | Haydock et al. | .............. | 310/71 |
| 6,600,244 B2 * | 7/2003 | Okazaki et al. | ............... | 310/71 |
| 6,737,773 B2 * | 5/2004 | Hayashi et al. | ............... | 310/71 |
| 2001/0025718 A1 * | 10/2001 | Maruyama et al. | ........ | 174/72 B |
| 2003/0173842 A1 * | 9/2003 | Kobayashi et al. | ............ | 310/71 |

FOREIGN PATENT DOCUMENTS

JP  3489484  11/2003
JP  3669313  4/2005

* cited by examiner

Primary Examiner—Burton Mullins
Assistant Examiner—Alex W Mok
(74) Attorney, Agent, or Firm—Westerman, Hattori, Daniels & Adrian, LLP.

(57) ABSTRACT

A bus bar secured to a stator in an electric motor in a preferred embodiment according to the invention includes four wiring boards, which are arranged perpendicularly to a center axis at intervals in a direction toward the center axis, and a resin portion for covering the surroundings of the four wiring boards by injection molding. Resin passing holes, through which a resin flows when the resin portion is molded, are formed at each of the wiring boards. When the bus bar is molded, the resin is injected into a resin molding die in a state in which the four wiring boards are supported by supporting pins disposed inside of the die. The resin flows to and fro between a space defined between the die and the wiring board and a space defined between the adjacent wiring boards.

20 Claims, 6 Drawing Sheets ic motor.

MOTOR AND BUS BAR

FIELD OF THE INVENTION

The invention relates to an electric motor and a bus bar used in the electric motor.

BACKGROUND OF THE INVENTION

An electric motor in the prior art has been provided with a bus bar, in which wiring is configured for connecting a stator and an outside wiring to each other. Such a bus bar has included, for example, thin plate-like wiring members, which are formed into an annular shape on the axis of the motor and are laminated at predetermined intervals in an axial direction, and an insulating member, which is disposed between the plurality of wiring members so as to electrically insulate the wiring members from each other.

As a bus bar fabricating method has been conventionally known a method for molding the plurality of wiring members with a resin by injecting the resin into a die, in which the wiring members are held at the predetermined intervals. In this case, the resin filled between the plurality of wiring members has been constituted as the insulating member.

However, in the case where the bus bar is fabricated by integrally molding the plurality of wiring members with the resin, as described above, the resin injected into the die has been hardly injected into the wiring members, thereby possibly degrading the strength of the bus bar or insulation between the wiring members.

SUMMARY OF THE INVENTION

According to the invention, it is possible to readily fill a resin between wiring members when a bus bar in an electric motor is fabricated by injection molding.

An electric motor according to one aspect of the invention comprises: a stationary assembly having a stator; a rotor assembly having a field magnet for generating torque on a center axis between the stator and the field magnet; and a bearing mechanism for rotatably supporting the rotor assembly with respect to the stationary assembly about the center axis. The stationary assembly is provided with a bus bar arranged on one side of the stator in an axial direction, followed by being subjected to wiring for supplying a driving current to the stator.

The bus bar includes: two or more wiring members, which are arranged with an interval in the axial direction; and a resin portion for covering the surroundings of the two or more wiring members by injection molding. One or more of the two or more wiring members have a through hole, through which a resin passes when the resin portion is molded.

Thus, in the electric motor according to one aspect of the invention, the resin can be readily filled between the wiring members.

DETAILED DESCRIPTION OF THE PREFERRED EMBODIMENT

Figure 1:
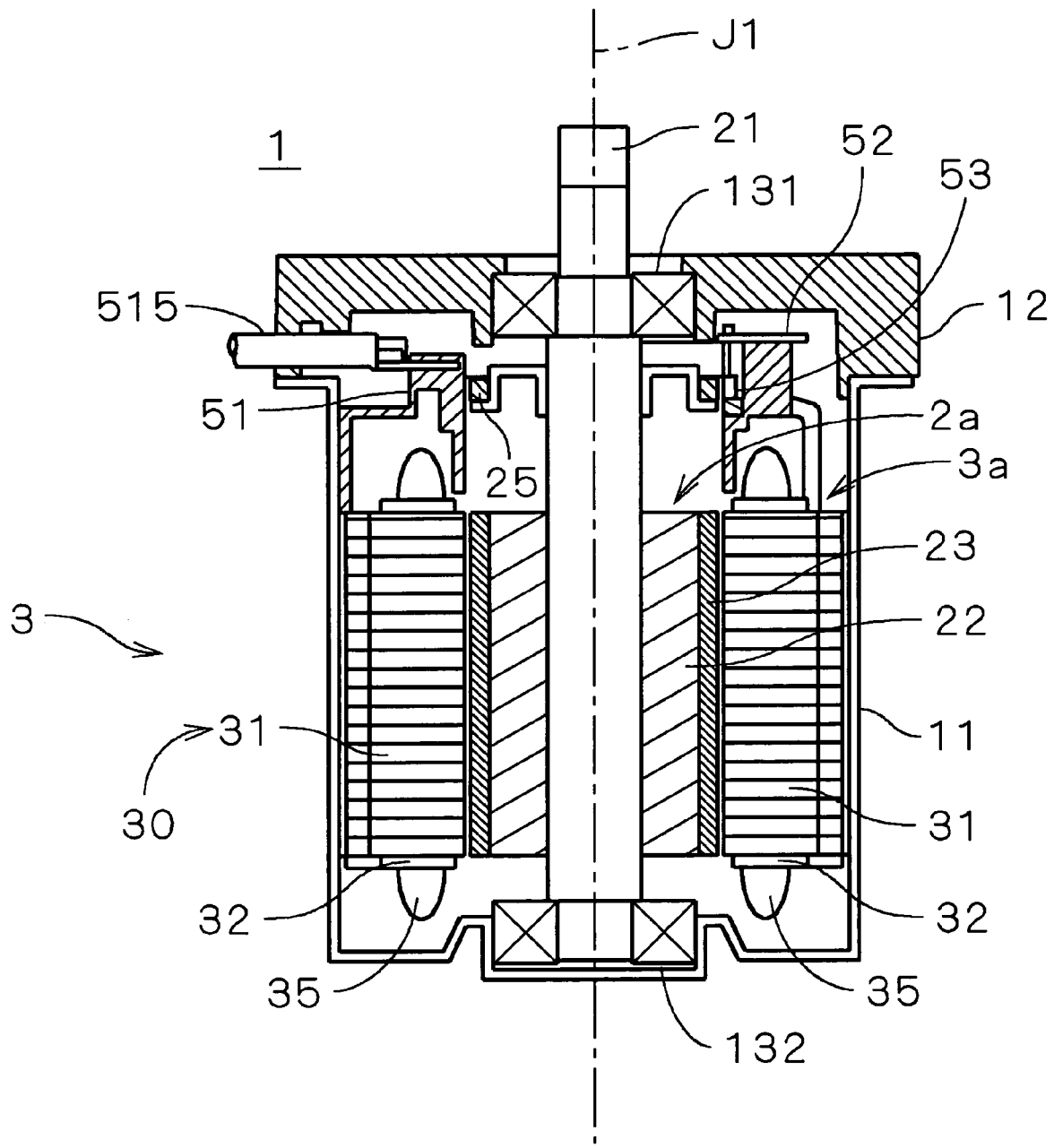
FIG. 1 is a vertical cross-sectional view showing a motor.

FIG. 1 is a vertical cross-sectional view showing an electric motor 1 in a preferred embodiment according to the invention. The motor 1 is a so-called brushless motor, which is used as, for example, a drive source for a power steering in an automobile. Incidentally, parallel hatch lines at fine portions in cross section will be omitted in FIG. 1.

In FIG. 1, the motor 1 is covered with a cylindrical housing 11, which is opened upward, and a cover 12, which is adapted to close the opening of the housing 11 and has an opening at the center thereof. Ball bearings 131 and 132 are fixed to the opening of the cover 12 and the bottom of the housing 11, respectively. The ball bearings 131 and 132 rotatably support a shaft 21.

To the shaft 21 is attached a columnar rotor yoke 22 inside of the housing 11. At an outer peripheral surface of the rotor yoke 22 is secured a field magnet 23 magnetized in a multi-polar manner. A sintered material containing neodymium, for example, is used as the field magnet 23.

In the meantime, at an inner circumferential surface of the housing 11 is disposed a stator 3 in a manner opposite to the field magnet 23. The stator 3 is arranged such that its center axis J1 accords with the center axis of the shaft 21. The stator 3 includes a plurality of teeth 31 radially arranged on the center axis J1 in a state in which a tip is oriented toward the center axis J1 from the inner circumferential surface of an annular portion of a core 30 molded of a magnetic material (that is, extending from the inner circumferential surface of the housing 11 toward the shaft 21 and the field magnet 23), an insulator 32 covering the plurality of teeth 31, and a coil 35 disposed by winding a conductive wire around the plurality of teeth 31 via the insulator 32 in a multi-layered manner. The coil 35 is configured by winding the conductive wire around the teeth 31 and the insulator 32 in a vertical direction (i.e., in a direction of the center axis J1).

A bus bar 51, which is subjected to wiring for supplying a driving current to the coil 35 in the stator 3, is disposed on a side of the cover 12 in the stator 3 in the direction along the center axis J1. The bus bar 51 is connected to a wiring 515 extending outward. Furthermore, on the side of the cover 12 in the bus bar 51 is disposed a detecting circuit board 52 having a Hall element or the like mounted thereon.

In the motor 1, a rotor assembly 2a include the shaft 21, the rotor yoke 22 and the field magnet 23: in contrast, a stationary assembly 3a include the stator 3, the bus bar 51 and the circuit board 52, which are fixed inside of the housing 11. The ball bearings 131 and 132 serving as bearing mechanisms rotatably support the rotor assembly 2a relatively to the stationary assembly 3a on the center axis J1. Torque is generated on the center axis J1 between the stator 3 and the field magnet 23 by supplying the driving current to the stator 3 via the bus bar 51, thereby rotating the rotor assembly 2a.

Figure 2:
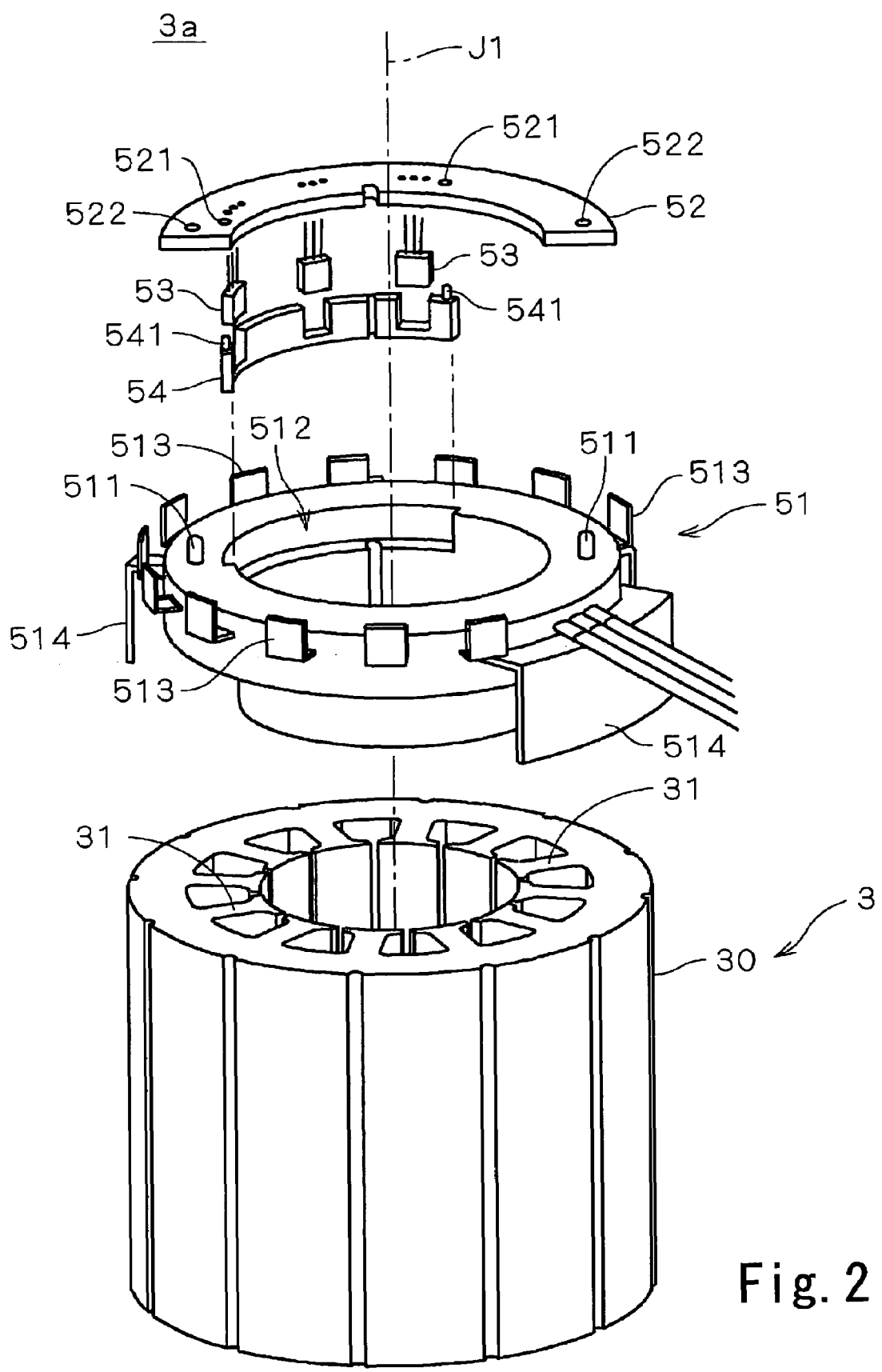
FIG. 2 is an exploded perspective view showing a stationary assembly.

On the circuit board 52 are mounted three Hall elements 53 projecting downward (see FIG. 2). The Hall elements 53 are held by a sensor holder, described later. In the meantime, an annular magnet 25 is secured onto the side of the cover 12 of the field magnet 23 via a flange in the shaft 21. The magnet 25 faces to the Hall elements 53. The magnet 25 is magnetized in a multi-polar manner, like the field magnet 23. The position of the field magnet 23 can be indirectly detected by detecting the position of the magnet 25 by the Hall elements 53. The driving current to be supplied to the stator 3 is controlled on the basis of the detection result.

FIG. 2 is an exploded perspective view showing the configuration of the essential parts in the stationary assembly 3a.

Although only the core 30 is shown as to the stator 3 in FIG. 2, in actual, the stator 3 having the coil 35 formed thereat is prepared by covering the teeth 31 of the core 30 with the insulator 32 and winding the conductive wire around the insulator 32 when the bus bar 51 is fixed to the stator 3 (see FIG. 1).

The bus bar 51 is fixed to the stator 3 by inserting the cylindrical portion formed at the lower portion of the center opening into the center opening formed at the core 30 and connecting the conductive wire from the coil 35, not shown, to terminals 513 erected on the periphery by means of caulking. At this time, a plurality of legs 514 formed on the periphery of the bus bar 51 abut against the upper surface of the core 30. Moreover, the tip of each of the legs 514 is fitted into a vertical groove formed at the outer peripheral surface of the core 30, so that the position of the bus bar 51 is determined with respect to the core 30.

In the meantime, the Hall element 53 is inserted into and held in each of recesses formed at a sensor holder 54. The sensor holder 54 is fixed to the circuit board 52 by inserting the tips of the Hall element 53 into holes formed at a land on the circuit board 52. Moreover, the tips of the Hall element 53 are secured to the circuit board 52 by soldering, such that the Hall element 53 projects from the mounting surface of the circuit board 52. Two pins 541 are formed at the sensor holder 54 on the side of the circuit board 52, and further, holes 521 are formed at positions corresponding to the two pins 541 at the circuit board 52. Therefore, the sensor holder 54 is fixed by inserting the pins 541 into the holes 521, followed by thermally fusing and crushing the pins 541 by thermal welding.

Two projections 511 are formed at the upper surface of the bus bar 51, and further, inserting holes 522 corresponding to the projections 511 are formed at the circuit board 52. The projections 511 are inserted into the inserting holes 522 in the stationary assembly 3a, to which the bus bar 51 is fixed. After the sensor holder 54 is positioned with respect to the core 30, the circuit board 52 is firmly secured to the bus bar 51 by thermally welding, i.e., fusing and crushing the projections 511. Incidentally, a concavity 512 is formed at the inner circumferential surface of the bus bar 51. Therefore, the sensor holder 54 is fitted into the concavity 512.

Figure 3:
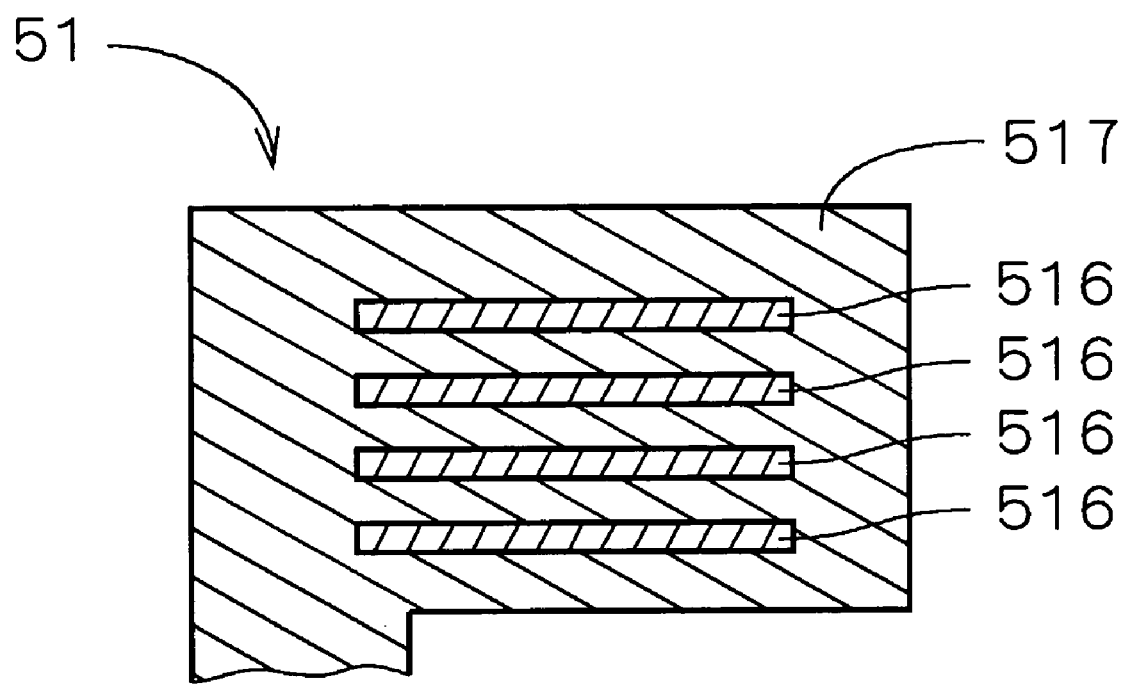
FIG. 3 is a cross-sectional view showing a bus bar.

FIG. 3 is a partly cross-sectional view showing the bus bar 51 in a cross section containing the center axis J1 (see FIG. 2). As shown in FIG. 3, the bus bar 51 includes four metallic wiring boards 516 arranged perpendicularly to the center axis J1 at intervals in the direction toward the center axis J1, and a resin portion 517 for covering the surroundings of the four wiring boards 516 by injection molding so as to electrically insulate the four wiring boards 516 from each other. The terminals 513 and a terminal 513a, described later, (see FIG. 4) projecting from each of the wiring boards 516 project and are exposed to the resin portion 517.

Figure 4:
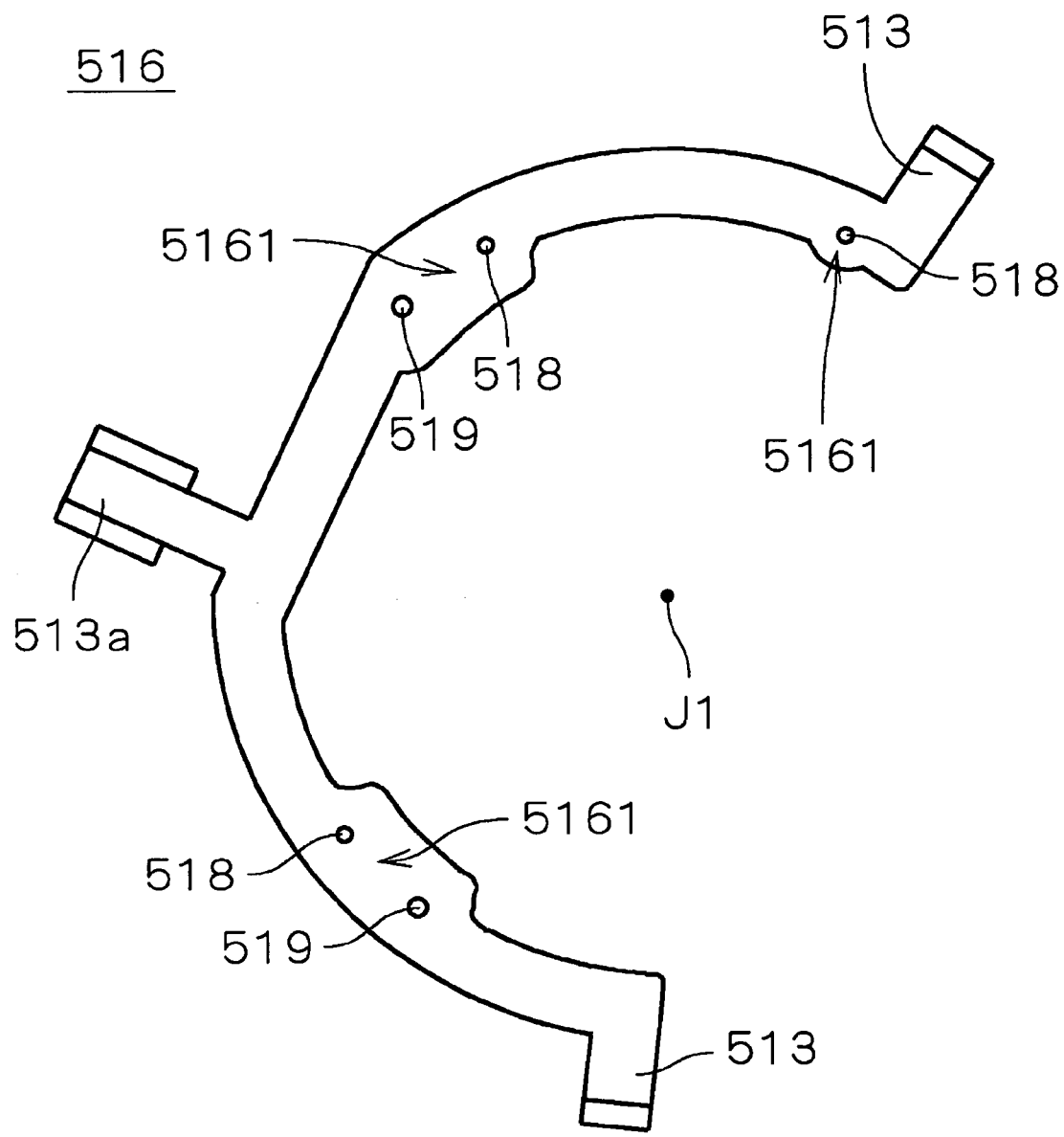
FIG. 4 is a plan view showing a wiring board.

FIG. 4 is a plan view showing one of the wiring boards 516. As shown in FIG. 4, the wiring board 516 is made of an arcuate and belt-like member on the center axis J1, and has the two terminals 513 on the periphery opposite to each other with the center axis J1 held therebetween and the terminal 513a to be connected to the wiring 515 (see FIG. 1). At the wiring board 516 are formed supporting holes 518 serving as through holes, into which supporting pins, described later, are inserted, and resin passing holes 519 serving as through holes, through which the resin passes when the resin portion 517 (see FIG. 3) is molded. The width of the wiring board 516 at a portion 5161 having the supporting hole 518 and/or the resin passing hole 519 formed at the wiring board 516 (hereinafter referred to as "a through hole portion") is made to be greater than the width of a portion around the hole portion 5161. As a consequence, it is possible to prevent any substantial reduction of the width of the wiring board 516 (i.e., a cross-sectional area) owing to the supporting hole 518 and the resin passing hole 519, so as to suppress any increase in resistance of the wiring board 516 at the hole portion 5161, and further, to uniformly irradiate heat at the hole portions 5161 and other portions at the wiring board 516. Incidentally, each of the other two wiring boards 516 is formed into a shape in conformity with that shown in FIG. 4, but the residual one wiring board 516 is provided with the hole portions 5161 having the supporting holes 518 and the resin passing holes 519 formed thereat and the two terminals 513 but without any terminal 513a.

Figure 5:
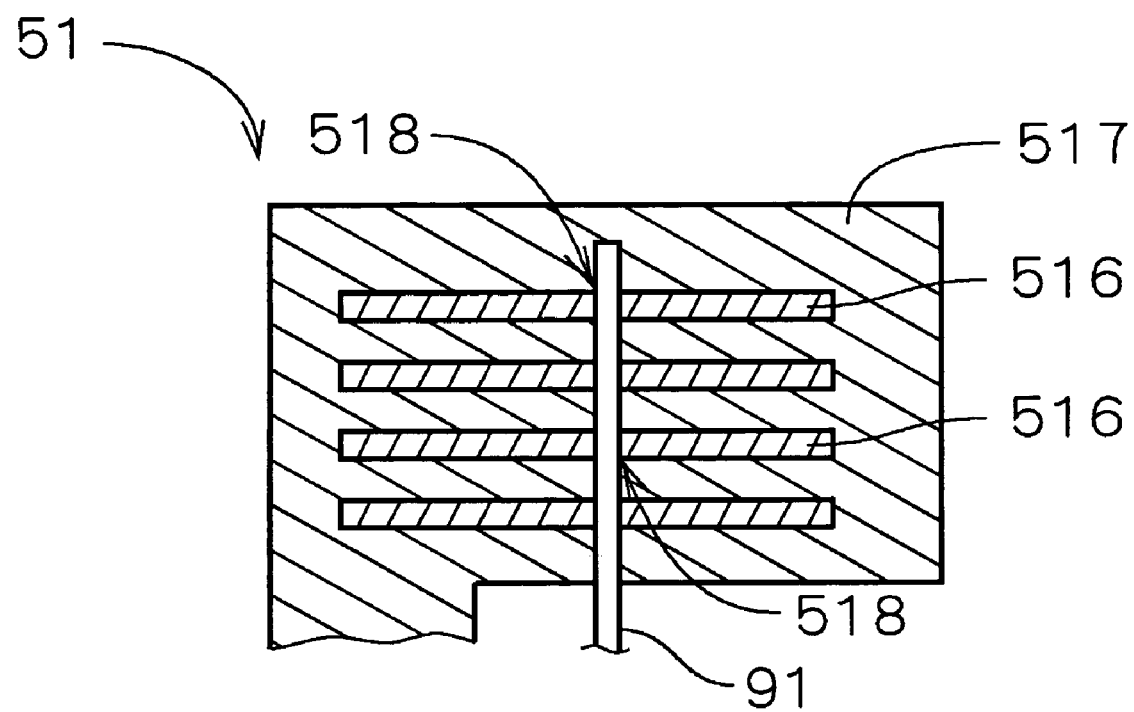
FIG. 5 is a cross-sectional view showing the bus bar.
Figure 6:
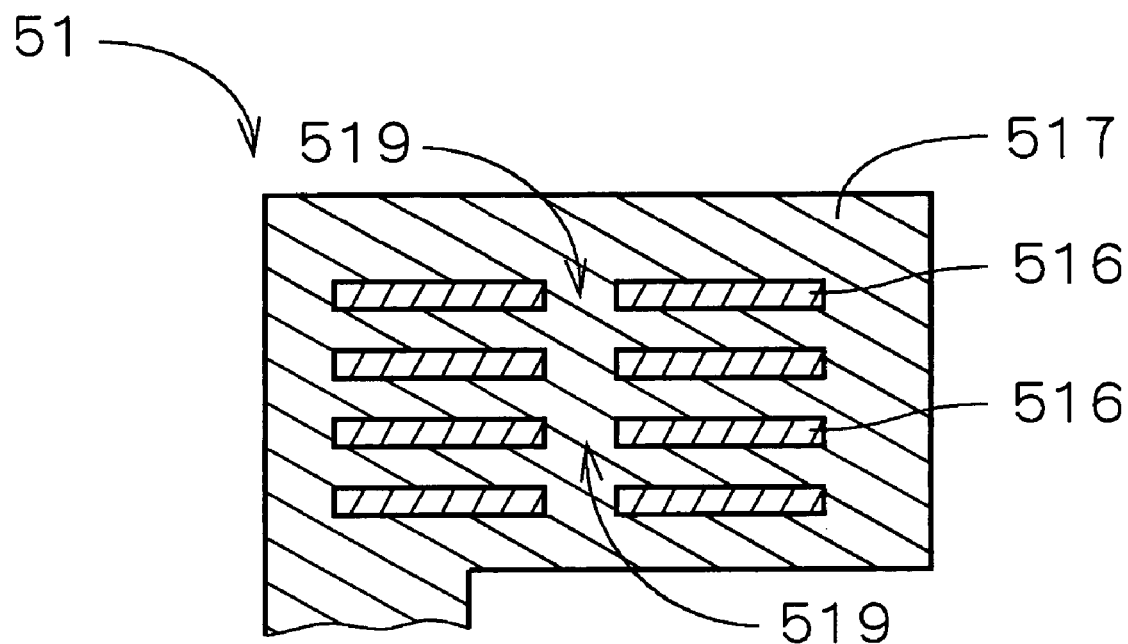
FIG. 6 is another cross-sectional view showing the bus bar.

FIG. 5 is a cross-sectional view showing the bus bar 51 in a cross section containing the supporting holes 518 formed at the wiring board 516; and FIG. 6 is another cross-sectional view showing the bus bar 51 in a cross section containing the resin passing holes 519. When the bus bar 51 is molded, the four wiring boards 516 are supported at the predetermined intervals by inserting a plurality of supporting pins 91 housed inside of a resin molding die, not shown, into the supporting holes 518 formed at the four wiring boards 516, and further, holding the terminals 513 and 513a by the die, followed by injection of the resin into the die in this state, as shown in FIG. 5. Incidentally, the positions and projecting quantities of the terminals 513 and 513a are set such that the terminals 513 and 513a of one of the wiring boards 516 never overlap with the terminals 513 and 513a of the other wiring boards 516 in the direction, in which the center axis J1 extends, when the four wiring boards 516 are laminated at the predetermined intervals, as shown in FIG. 3. In contrast, the supporting holes 518 and the resin passing holes 519 formed at the wiring boards 516 are set in such a manner as to overlap with each other in the direction, in which the center axis J1 extends.

The resin injected into the die flows to and fro through a space defined between the die and the wiring board 516 and a space defined between the adjacent wiring boards 516 via the resin passing holes 519 previously formed at each of the wiring boards 516, as shown in FIG. 6. The resin is filled into the spaces (i.e., the inside of the die), thereby molding the resin portion 517. In this manner, the formation of the resin passing holes 519 at each of the wiring boards 516 enables the resin to be readily filled between the wiring boards 516 when the bus bar 51 is molded. After the resin portion 517 is molded, the supporting pins 91 are withdrawn from the supporting holes 518 formed at the wiring boards 516 and the resin portion 517, and further, the terminals 513 and 513a are released from being held by the corresponding dies, thus completing the fabrication of the bus bar 51. In the bus bar 51, no resin is filled into the supporting holes 518 formed at the wiring boards 516, into which the supporting pins 91 are inserted in molding the resin portion 517: in contrast, the resin is filled into the resin passing holes 519.

In the case where the motor 1 is used as the drive source for the power steering in the automobile, a great current flows in the stator 3. As a consequence, even if a resistance variation, deficient heat irradiation, insufficient insulation or deformation slightly occurs at the wiring board 516 in the bus bar 51, such deficiency adversely influences on motor characteristics, thereby possibly exerting on the operating feeling of the power steering. However, as described above, the resin can be readily filled between the wiring boards 516 adjacent to each other in the bus bar 51 in the motor 1, thereby preventing the insufficient insulation of the wiring board 516, the deformation of the wiring board 516 during the solidification of the resin, or the like, so as to implement the motor and power steering equipped with a high reliability. Thus, the motor 1 is suitable for the usage, in which the high reliability is required, like in the power steering.

In the above-described preferred embodiment, since the resin passing holes 519 are formed at all of the four wiring boards 516, the resin can be readily filled into all of the spaces defined between the wiring boards 516. Even if the resin passing hole 519 is not formed at any one of the four wiring boards 516, in other words, even in the case where the resin passing holes 519 are formed at all of the wiring boards 516 except for one specific wiring board 516, the resin flows through the resin passing holes 519 on both sides of the specific wiring board 516 having no resin passing hole 519 formed thereat, so that the resin can be readily filled into all of the spaces defined between the wiring boards 516.

Although the preferred embodiment according to the invention has been described above, the invention is not limited to the above-described preferred embodiment, but various modifications and alterations can be carried out.

For example, from the viewpoint of the easy filling of the resin into all of the spaces defined between the wiring boards 516, it is preferable that the resin passing holes 519 should be formed at three out of the four wiring boards 516 or all of the four wiring boards 516. However, as long as the resin passing hole 519 is formed at one or more wiring boards 516 at portions, into which the resin hardly flows, the resin can be readily filled between the wiring boards 516.

Furthermore, the number of wiring boards 516 disposed in the bus bar 51 is not always limited to four. For example, as long as the resin passing holes 519 are formed at one or more wiring boards 516 in the bus bar 51 provided with the two or more wiring boards 516, the resin can be readily filled between the adjacent wiring boards 516, in the same manner as the aforementioned embodiment.

What is claimed is:

1. An electric motor comprising:
a stationary assembly having a stator;
a rotor assembly having a field magnet for generating torque on a center axis between the stator and the field magnet;
a bearing mechanism for rotatably supporting the rotor assembly with respect to the stationary assembly about the center axis; and
a bus bar disposed in the stationary assembly and arranged on one side of the stator in an axial direction;
the bus bar comprising:
two or more wiring members made of metal material and each adjoining two wiring members arranged with an interval in the axial direction, the wiring members supplying a driving current to the stator; and
a resin portion for covering the surroundings of the two or more wiring members by injection molding;
wherein a through hole is formed at one or more of the two or more wiring members, and through which a resin passes when the resin portion is molded.

2. An electric motor according to claim 1, wherein a width of the wiring member in a radial direction at a hole portion, at which the through hole is formed, is greater than that of a periphery of the hole portion.

3. An electric motor according to claim 1, wherein the through hole is formed through the two or more wiring members.

4. An electric motor according to claim 2, wherein each of the two or more wiring members or each of the wiring members except for one specific wiring member has the through hole, through which the resin passes when the resin portion is molded.

5. An electric motor according to claim 1, wherein each of the two or more wiring members or each of the wiring members except for one specific wiring member has the through hole, through which the resin passes when the resin portion is molded.

6. An electric motor according to claim 1, wherein each of the two or more wiring members is an arc-shaped member on the center axis and is formed into a belt-like shape perpendicular to the center axis.

7. An electric motor according to claim 1, wherein the through hole formed on one of the wiring members is aligned with that formed on the other(s) of the wiring members in the axial direction such that a melt resin passes.

8. An electric motor according to claim 1, wherein the bus bar further comprises a supporting hole formed on each of the wiring members, wherein the supporting hole formed on one of the wiring members is aligned with that formed on the other(s) of the wiring members in the axial direction, such that a support pin can be inserted therein.

9. An electric motor according to claim 1, wherein the bus bar further comprises a terminal formed on each of the wiring members, wherein the terminal formed on one of the wiring members does not overlap with that formed on the other(s) of the wiring members in the axial direction.

10. A bus bar arranged on one side of a stator in an axial direction in an electric motor, the bus bar comprising:
two or more wiring members made of metal material and each adjoining two wiring members arranged with an interval in the axial direction, the wiring members supplying a driving current to the stator; and
a resin portion for covering the surroundings of the two or more wiring members by injection molding;
wherein a through hole is formed at one or more of the two or more wiring members, and through which a resin passes when the resin portion is molded.

11. A bus bar according to claim 10, wherein a width of the wiring member in a radial direction at a hole portion, at which the through hole is formed, is greater than that of a periphery of the hole portion.

12. A bus bar according to claim 10, wherein the through hole is formed through the two or more wiring members.

13. A bus bar according to claim 11, wherein each of the two or more wiring members or each of the wiring members except for one specific wiring member has the through hole, through which the resin passes when the resin portion is molded.

14. A bus bar according to claim 10, wherein each of the two or more wiring members or each of the wiring members except for one specific wiring member has the through hole, through which the resin passes when the resin portion is molded.

15. A bus bar according to claim 10 wherein each of the two or more wiring members is an arc-shaped member on the center axis and is formed into a belt-like shape perpendicular to the center axis.

16. A bus bar according to claim 10, wherein the through hole formed on one of the wiring members is aligned with that formed on the other(s) of the wiring members in the axial direction such that a melt resin passes.

17. A bus bar according to claim 10, wherein the bus bar further comprises a supporting hole formed on each of the wiring members, wherein the supporting hole formed on one of the wiring members is aligned with that formed on the other(s) of the wiring member in the axial direction, such that a support pin can be inserted therein.

18. A bus bar according to claim 10, wherein the bus bar further comprises a terminal formed on each of the wiring members, wherein the terminal formed on one of the wiring members does not overlap with that formed on the other(s) of the wiring members in the axial direction.

19. An electric motor comprising:
- a stationary assembly having a stator;
- a rotor assembly having a field magnet;
- a bearing mechanism for rotatably supporting the rotor assembly with respect to the stationary assembly; and
- a bus bar disposed on the stationary assembly, the bus bar supplying a driving current to the stator; the bus bar comprising:
  - a first metal wiring member having a first through hole;
  - a second metal wiring member adjoining the first metal wiring member, wherein the second metal wiring member has a second through hole, wherein the first through hole is aligned with the second through hole such that a melt resin passes through the first through hole and the second through hole; and
  - a resin portion covering the first metal wiring member and the second metal wiring member, wherein the resin portion is formed by injection molding.

20. An electric motor according to claim 19, wherein the bus bar further comprises a first terminal formed on the first metal wiring member and a second terminal formed on the second metal wiring member, wherein the first terminal does not overlap with the second terminal when seen along a center axis of the rotor assembly.

* * * * *